(12) United States Patent
Chen et al.

(10) Patent No.: US 8,603,862 B2
(45) Date of Patent: Dec. 10, 2013

(54) PRECISE-ALIGNED LOCK-AND-KEY BONDING STRUCTURES

(75) Inventors: Kuan-Neng Chen, Hsinchu (TW); Fei Liu, Mt. Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 668 days.

(21) Appl. No.: 12/780,086

(22) Filed: May 14, 2010

(65) Prior Publication Data

US 2011/0278063 A1    Nov. 17, 2011

(51) Int. Cl.
H01R 4/02      (2006.01)
B23K 31/02     (2006.01)

(52) U.S. Cl.
USPC ............ 438/108; 438/106; 257/737; 257/778

(58) Field of Classification Search
USPC .......... 257/737, 738; 438/612, 613, 106, 108
See application file for complete search history.

(56) References Cited

U.S. PATENT DOCUMENTS

| | | | |
|---|---|---|---|
| 4,818,728 A * | 4/1989 | Rai et al. | 438/108 |
| 5,214,308 A * | 5/1993 | Nishiguchi et al. | 257/692 |
| 5,236,118 A | 8/1993 | Bower et al. | |
| 5,292,054 A * | 3/1994 | Leeb et al. | 228/179.1 |
| 5,468,681 A * | 11/1995 | Pasch | 438/108 |
| 6,022,761 A * | 2/2000 | Grupen-Shemansky et al. | 438/125 |
| 6,027,346 A * | 2/2000 | Sinsheimer et al. | 439/66 |
| 6,330,132 B1 * | 12/2001 | Honda | 360/234.5 |
| 6,517,359 B1 * | 2/2003 | Felps et al. | 439/63 |
| 6,541,340 B2 * | 4/2003 | Itoh | 438/270 |
| 6,759,738 B1 * | 7/2004 | Fallon et al. | 257/690 |
| 6,815,336 B1 * | 11/2004 | Shue et al. | 438/626 |
| 7,064,055 B2 | 6/2006 | Reif et al. | |
| 7,122,884 B2 | 10/2006 | Cabahug et al. | |
| 7,307,349 B2 * | 12/2007 | Hikita et al. | 257/778 |
| 7,368,806 B2 * | 5/2008 | Liu et al. | 257/676 |
| 7,745,301 B2 * | 6/2010 | Vora | 438/401 |
| 2004/0219713 A1 * | 11/2004 | Lee | 438/106 |
| 2005/0253274 A1 * | 11/2005 | Hikita et al. | 257/777 |
| 2006/0276109 A1 * | 12/2006 | Roy et al. | 451/41 |
| 2007/0108906 A1 * | 5/2007 | Kang et al. | 313/582 |
| 2007/0167015 A1 * | 7/2007 | Kondo et al. | 438/692 |
| 2008/0164153 A1 * | 7/2008 | Bajaj | 205/663 |

(Continued)

OTHER PUBLICATIONS

Ate He, "Fabrication of High Performance Chip-to-Substrate Input/Output Interconnections," A thesis presented to the Academic Faculty, Georgia institute of Technology, pp. 1-147 (May 2007).

*Primary Examiner* — Cheung Lee
*Assistant Examiner* — William Harriston
(74) *Attorney, Agent, or Firm* — Vazken Alexanian; Michael J. Chang, LLC

(57) ABSTRACT

Copper (Cu)-to-Cu bonding techniques are provided. In one aspect, a bonding method is provided. The method includes the following steps. A first bonding structure is provided having at least one copper pad embedded in a first insulator and at least one via in the first insulator over the copper pad, wherein the via has tapered sidewalls. A second bonding structure is provided having at least one copper stud embedded in a second insulator, wherein a portion of the copper stud is exposed for bonding and has a domed shape. The first bonding structure is bonded to the second bonding structure by way of a copper-to-copper bonding between the copper pad and the copper stud, wherein the via and the copper stud fit together like a lock-and-key. A bonded structure is also provided.

8 Claims, 10 Drawing Sheets

(56) References Cited

U.S. PATENT DOCUMENTS

2009/0191688 A1* 7/2009 Hu et al. ................. 438/424
2010/0159697 A1* 6/2010 Jung ......................... 438/692
2011/0230126 A1* 9/2011 Boutaghou .................. 451/527

* cited by examiner

1700

PRECISE-ALIGNED LOCK-AND-KEY BONDING STRUCTURES

FIELD OF THE INVENTION

The present invention relates to copper (Cu)-to-Cu bonding techniques and more particularly, to Cu-to-Cu bonding techniques that employ a lock-and-key design to minimize or eliminate misalignment during bonding.

BACKGROUND OF THE INVENTION

Copper (Cu)-to-Cu bonding is a technique commonly used to form interconnects in electronic device structures. One drawback to conventional Cu-to-Cu bonding techniques is that any amount of misalignment between the Cu interconnect structures can lead to damaged/poor bonding between the structures, and potentially even to failure of the bond.

For example, the Cu interconnect structures can include complementary Cu pads that are brought together and bonded by way of a compression bond. If the pads are misaligned, e.g., the face of one pad is shifted to the left or to the right relative to the face of the other pad, then the bonding might be adversely affected. Specifically, the misalignment can cause a portion of the pads to not make contact with each other. Even worse, if the misalignment is severe enough, then the pads might encounter other structures when being brought together, further compromising the bond.

Since, in practice, some level of misalignment cannot be avoided, techniques that minimize the amount of misalignment and thus improve bonding quality and reliability would be desirable.

SUMMARY OF THE INVENTION

The present invention provides copper (Cu)-to-Cu bonding techniques. In one aspect of the invention, a bonding method is provided. The method includes the following steps. A first bonding structure is provided having at least one copper pad embedded in a first insulator and at least one via in the first insulator over the copper pad, wherein the via has tapered sidewalls. A second bonding structure is provided having at least one copper stud embedded in a second insulator, wherein a portion of the copper stud is exposed for bonding and has a domed shape. The first bonding structure is bonded to the second bonding structure by way of a copper-to-copper bonding between the copper pad and the copper stud, wherein the via and the copper stud fit together like a lock-and-key.

In another aspect of the invention, a bonded structure is provided. The structure includes a first bonding structure having at least one copper pad embedded in a first insulator and at least one via in the first insulator over the copper pad, wherein the via has tapered sidewalls; and a second bonding structure having at least one copper stud embedded in a second insulator, wherein a portion of the copper stud is exposed for bonding and has a domed shape. The first bonding structure and the second bonding structure are bonded together by way of a copper-to-copper bonding between the copper pad and the copper stud, and wherein the via and the copper stud fit together like a lock-and-key.

A more complete understanding of the present invention, as well as further features and advantages of the present invention, will be obtained by reference to the following detailed description and drawings.

DETAILED DESCRIPTION OF PREFERRED EMBODIMENTS

Figure 1:
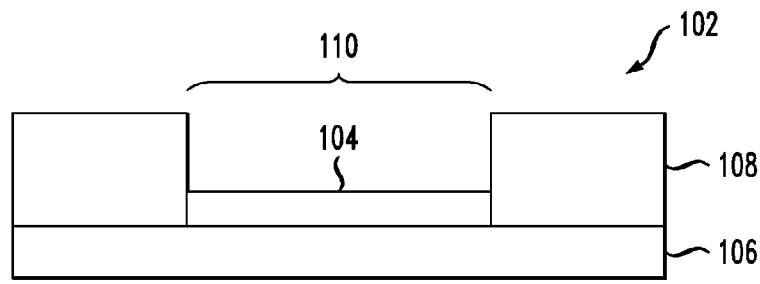
FIG. 1 is a cross-sectional diagram illustrating a first (bottom) bonding structure having a copper (Cu) pad embedded in an insulator and a via in the insulator over the Cu pad according to an embodiment of the present invention.

Provided herein are techniques for copper (Cu)-to-Cu bonding that involve employing a lock-and-key design between bonding structures (i.e., wafers). FIGS. 1-9 present a first exemplary lock-and-key configuration and illustrate how that configuration can minimize or eliminate misalignment of the bonding structures. For example, FIG. 1 is a cross-sectional diagram illustrating a first bonding structure 102 having Cu pad 104 embedded in an insulator (i.e., in an oxide). As will become apparent from the following description, the techniques presented herein involve the fabrication of two separate bonding structures that are then bonded together using Cu-to-Cu bonding. To schematically illustrate the process, each wafer is considered to have a top surface (or face) that includes Cu structures (i.e., Cu pads/studs) used in the bonding and a bottom surface (or back) opposite the top surface. In some implementations of the present techniques (see, for example, FIGS. 1-9 and 10-16), one of the two structures is flipped for bonding to the other. Since, in this instance, the top surfaces (or faces) of the structures are mated during the bonding, the process is termed "face-to-face" bonding. However, what is shown in FIGS. 1-9 and 10-16 is only one exemplary bonding configuration, and other bonding configurations, such as face-to-back bonding, may be implemented in the same manner. The specific bonding configuration employed, i.e., face-to-face, face-to-back, etc., depends on the particular application at hand and can, given the present teachings, be implemented by one of skill in the art.

Further, for ease and consistency of description, the first bonding structure will be referred to herein also as the bottom bonding structure since, in this particular embodiment, the second bonding structure (see below) is placed on top of the first bonding structure during bonding. Accordingly, the second bonding structure is also referred to herein as the top bonding structure.

The fabrication of first (bottom) bonding structure 102 begins, for example, with a wafer having an insulator, i.e., oxide layer 106. A substrate (not shown) may be present adjacent to oxide layer 106. In one exemplary embodiment, oxide layer 106 is a silicon dioxide ($SiO_2$) layer. Cu is plated onto oxide layer 106 and additional processing, if necessary (such as chemical-mechanical polishing (CMP) of the Cu), is performed to form Cu pad 104. Additional insulator, i.e., additional oxide material 108 (e.g., $SiO_2$), is deposited over Cu pad 104/oxide layer 106. Cu pad 104 is now embedded in the insulator. A via 110 is then formed in the insulator (i.e., in this example in the additional oxide material) over Cu pad 104 using, e.g., reactive ion etching (RIE) with Cu pad 104 acting as an etch stop.

Figure 2:
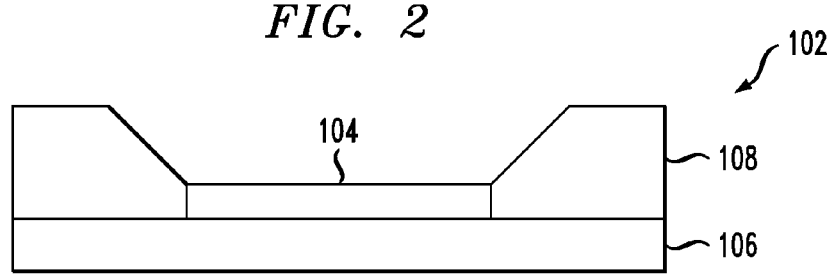
FIG. 2 is a cross-sectional diagram illustrating the sidewalls of the via of FIG. 1 having been tapered according to an embodiment of the present invention.

FIG. 2 is a cross-sectional diagram illustrating the sidewalls of via 110 having been tapered. This tapering can be accomplished in a number of ways. According to an exemplary embodiment, RIE is used to achieve the desired tapered shape, by changing the mix of chemistry, e.g., less tetrafluoromethane $CF_4$ or by reducing the bias power during the RIE. Accordingly, the shape of the via can have more (or less) taper. While first (bottom) bonding structure 102 is shown to have a single Cu pad embedded in an insulator and a via over the Cu pad having tapered sidewalls, it is to be understood that multiple pads/vias may be fabricated on a single bonding structure using the techniques as described herein. In fact, in some implementations it may be desirable to employ multiple Cu pads and studs in a bonding scheme (see, for example, FIGS. 18-22, described below).

Figure 3:
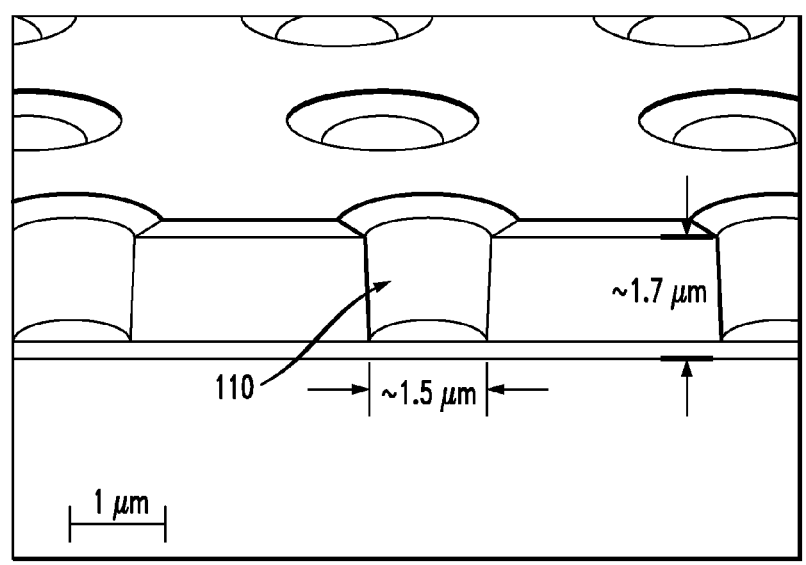
FIG. 3 is a schematic diagram of a bottom bonding structure produced using the present techniques according to an embodiment of the present invention.

FIG. 3 is a schematic diagram 300 of a bottom bonding structure produced using the techniques described above. It is notable from diagram 300 that each via 110 has tapered sidewalls, and has a width of about 1.5 micrometers (μm) at its base and a depth of about 1.7 μm. These dimensions are, however, merely exemplary.

Figure 4:
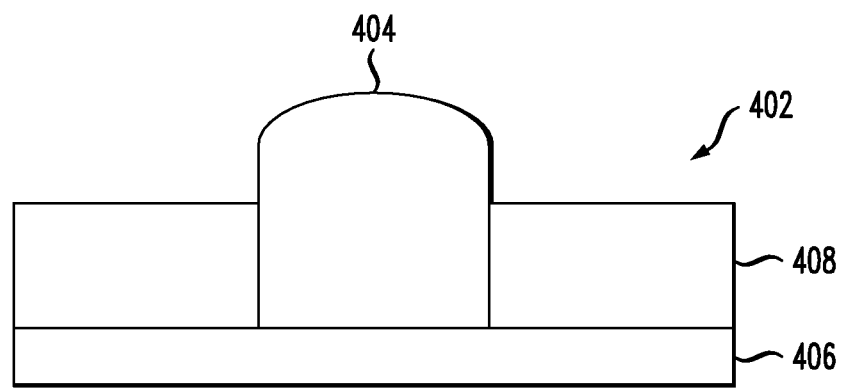
FIG. 4 is a cross-sectional diagram illustrating a second (top) bonding structure having a Cu stud embedded in an insulator, with a portion of the Cu stud exposed for bonding according to an embodiment of the present invention.

FIG. 4 is a cross-sectional diagram illustrating a second bonding structure 402 having Cu stud 404. As highlighted above, this particular example involves the face-to-face bonding of a bottom structure and a top structure. Bonding structure 402 in this instance is the top bonding structure, and will be flipped for bonding with the bottom bonding structure. The fabrication of second (top) bonding structure 402 begins, for example, with a wafer having an insulator, i.e., oxide layer 406 (e.g., a $SiO_2$ layer). A substrate (not shown) may be present adjacent to oxide layer 406. Cu is plated onto oxide layer 406 and additional processing, if necessary (such as CMP of the Cu), is performed to form Cu stud 404. Cu stud 404 will not yet have a domed tip as shown in FIG. 4, but will have a flat surface. The doming of Cu stud 404 will occur later in the process, see below. Additional insulator, i.e., additional oxide material 408 (e.g., $SiO_2$), is deposited over oxide layer 406/Cu stud 404 and planed down to the (flat) surface of Cu stud 404 (e.g., using CMP) to form Cu stud 404 embedded in the insulator. A second oxide-selective CMP or oxide-selective RIE is then used to recess the insulator (in this example additional oxide material 408) below Cu stud 404.

As shown in FIG. 4, a top (exposed) portion of Cu stud 404 has been rounded or domed. This doming of the Cu stud 404 can be achieved in a number of different ways. According to one exemplary embodiment, when an oxide-selective CMP is used to recess additional oxide material 408 below Cu stud 404 (see above), the doming is achieved at the same time (i.e., by the same process). Namely, the oxide-selective CMP process involves an oxide CMP pad that when being used to remove the additional oxide material also exerts force on the Cu stud. The Cu stud under the polish force is shaped into a dome. Alternatively, if for example, an oxide-selective RIE is used to recess additional oxide material 408 below Cu stud 404, then a separate oxide-selective CMP step can be subsequently used to dome the Cu stud.

While second (top) bonding structure 402 is shown to have a single domed Cu stud, it is to be understood that multiple studs may be fabricated on a single bonding structure using the techniques as described herein. In fact, in some implementations it may be desirable to employ multiple Cu pads and studs in a bonding scheme (see, for example, FIGS. 18-22, described below).

Figure 5:
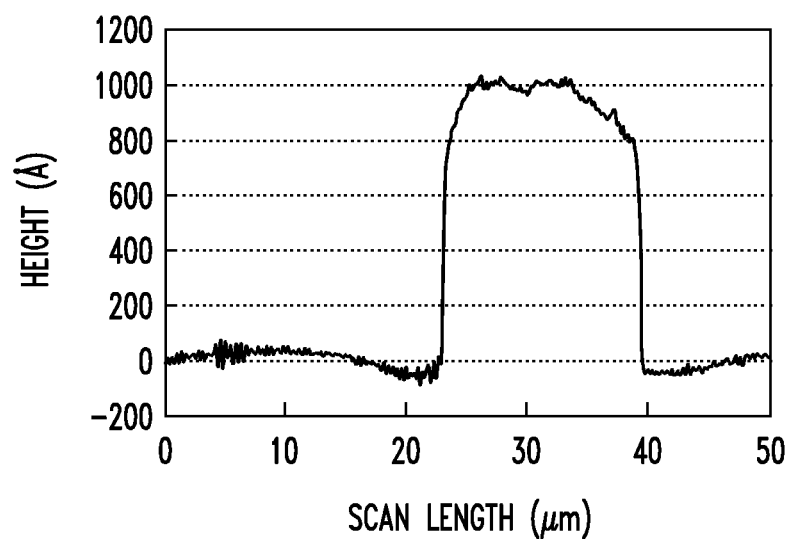
FIG. 5 is a graph illustrating how Cu chemical-mechanical polishing (CMP) can be used to dome the Cu stud of FIG. 4 according to an embodiment of the present invention.

FIG. 5 is a graph 500 illustrating how Cu CMP can be used to dome Cu stud 404. Specifically, in graph 500, scan length of a lateral dimension of a Cu stud (measured in μm) is plotted as a function of a height of the Cu stud (measured in angstroms (Å)). The domed shape Cu stud can be clearly seen from the graph.

Figure 6:
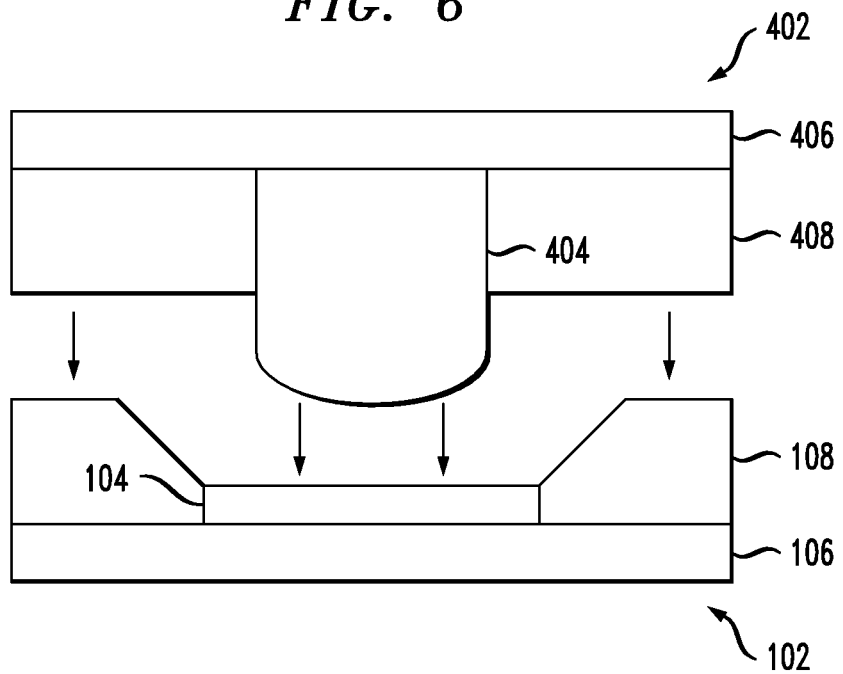
FIG. 6 is a cross-sectional diagram illustrating the first (bottom) bonding structure of FIG. 2 and the second (top) bonding structure of FIG. 4 lined up for face-to-face bonding according to an embodiment of the present invention.

FIG. 6 is a cross-sectional diagram illustrating first (bottom) bonding structure 102 and second (top) bonding structure 402 lined up for face-to-face bonding between Cu pad 104 and Cu stud 404, respectively. Cu stud 404 will engage with the beveled via, like a key in a lock, and make contact with Cu pad 104. Unlike what is shown in FIG. 6, the bonding structures are often misaligned during bonding. This misalignment can be minimized or eliminated using the present lock-and-key configuration, as is described in further detail below.

Figure 7:
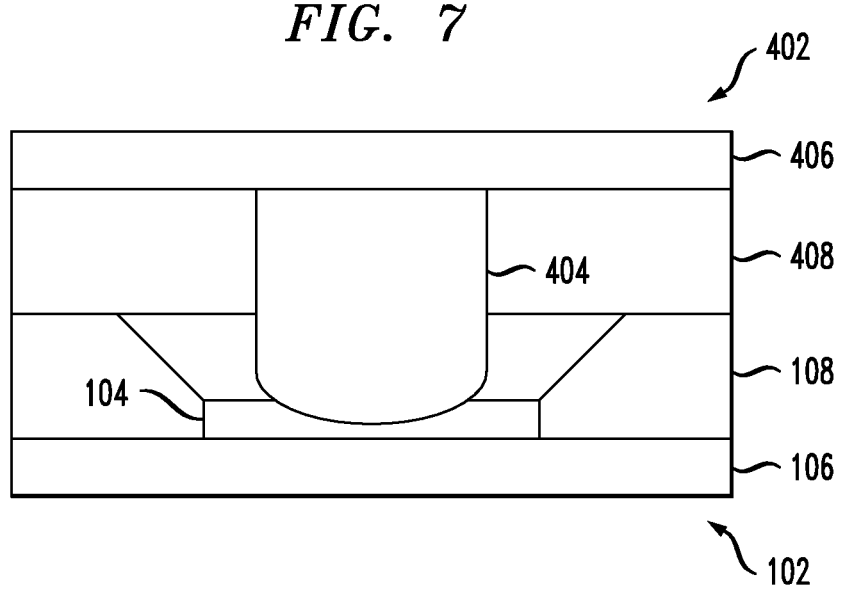
FIG. 7 is a cross-sectional diagram illustrating the first (bottom) bonding structure of FIG. 2 and the second (top) bonding structure of FIG. 4 bonded together in a face-to-face manner according to an embodiment of the present invention.

FIG. 7 is a cross-sectional diagram illustrating first (bottom) bonding structure 102 and second (top) bonding structure 402 bonded together in a face-to-face manner via Cu-to-Cu bonding between Cu pad 104 and Cu stud 404, respectively (although, as highlighted above, any other suitable bonding configuration, such as front-to-back bonding may be employed in the same manner). The Cu-to-Cu bonding between the stud and pad can be formed using thermocompressive bonding (see below).

Figure 8:
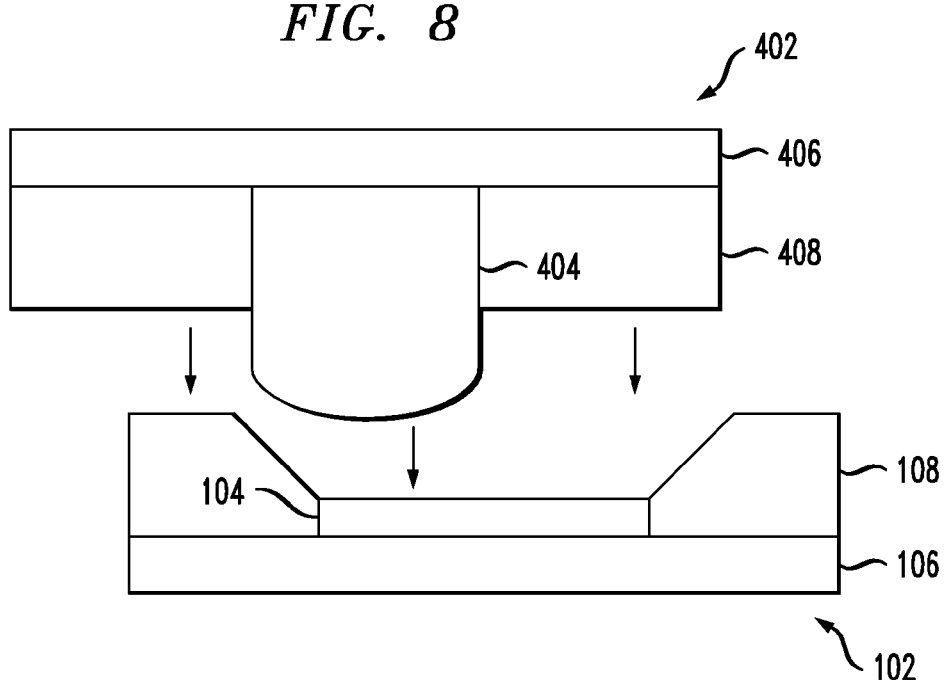
FIG. 8 is a cross-sectional diagram illustrating the first (bottom) bonding structure of FIG. 2 and the second (top) bonding structure of FIG. 4 positioned for face-to-face bonding wherein some misalignment of the bonding structures is present according to an embodiment of the present invention.

In instances when the first (bottom) bonding structure and the second (top) bonding structure are misaligned, the lock-and-key feature helps to re-align the structures. See, for example, FIGS. 8 and 9. FIG. 8 is a cross-sectional diagram illustrating first (bottom) bonding structure 102 and second (top) bonding structure 402 positioned for face-to-face bonding between Cu pad 104 and Cu stud 404, respectively. Unlike what is shown in FIG. 6, described above, there is some misalignment between the structures. However, when Cu stud 404 engages the tapered via, like a key in a lock, and when the structures are brought together, the tapered sidewalls of the via will shift the structures relative to one another (self-correcting the alignment), moving Cu stud 404 over to the surface of Cu pad 104. Further, the domed shape of Cu stud 404 ensures that it will pass smoothly over the tapered sidewalls of the via upon compression.

Figure 9:
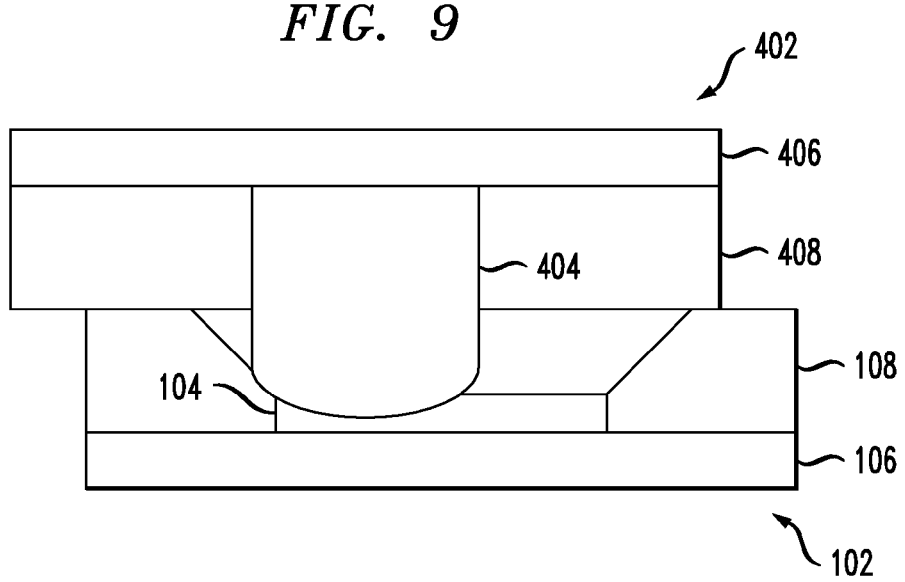
FIG. 9 is a cross-sectional diagram illustrating the first (bottom) bonding structure of FIG. 2 and the second (top) bonding structure of FIG. 4 bonded together in a face-to-face manner via wherein the misalignment is automatically corrected according to an embodiment of the present invention.

FIG. 9 is a cross-sectional diagram illustrating first (bottom) bonding structure 102 and second (top) bonding structure 402 bonded together in a face-to-face manner via Cu-to-Cu bonds between Cu pad 104 and Cu stud 404, respectively. As compared to FIG. 7, while the alignment between the structures is not perfect, the tapered sidewalls of the via have re-aligned Cu stud 404 with Cu pad 104.

Figure 10:
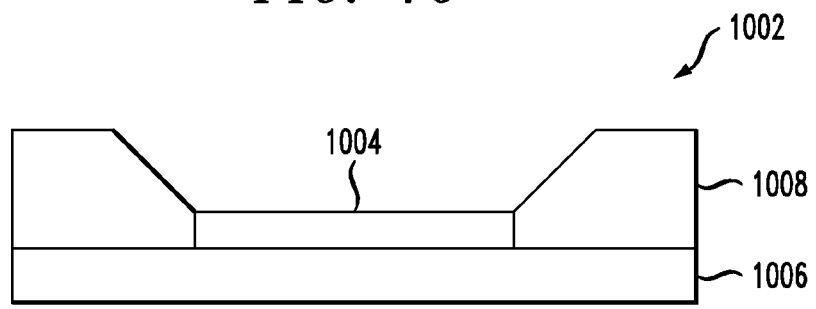
FIG. 10 is a cross-sectional diagram illustrating a first (bottom) bonding structure having a Cu pad embedded in an insulator and a via in the insulator over the Cu pad, the via having tapered sidewalls according to an embodiment of the present invention.

FIGS. 10-16, described below, present a second exemplary lock-and-key configuration and illustrate how that configuration can minimize or eliminate misalignment of the bonding structures. For example, FIG. 10 is a cross-sectional diagram illustrating a first bonding structure 1002 having Cu pad 1004. As in the example above, this exemplary embodiment also involves forming two separate bonding structures, a bottom and a top structure and then flipping the top structure for face-to-face bonding with the bottom structure. First bonding structure 1002 constitutes the bottom bonding structure in this example.

First (bottom) bonding structure 1002 can be fabricated using the techniques described, for example, in conjunction with the description of FIGS. 1 and 2, above. In fact, in some embodiments, the configuration of first bonding structure 1002 as shown in FIG. 10 is the same as first bonding structure 102 as shown in FIG. 2. Namely, first bonding structure 1002 includes a Cu pad 1004 embedded in an insulator, i.e., oxide layer 1006 and additional oxide material 1008, and a via having tapered sidewalls in the insulator over the Cu pad.

Figure 11:
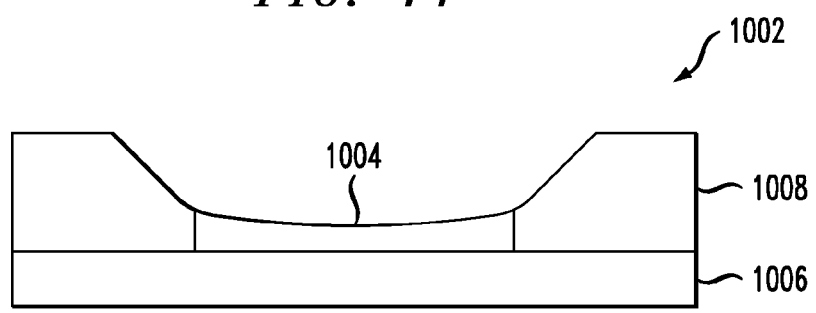
FIG. 11 is a cross-sectional diagram illustrating the Cu pad of FIG. 10 having been given a concave shape according to an embodiment of the present invention.

FIG. 11 is a cross-sectional diagram illustrating Cu pad 1004 having been given a concave shape. According to an exemplary embodiment, this concave shaping of Cu pad 1004 can be accomplished using a Cu CMP process. For example, during the Cu CMP, the center of Cu pad 1004 receives more polish work (than the edges) due to the presence of a hard material (i.e., the oxide) surrounding the pad.

Figure 12:
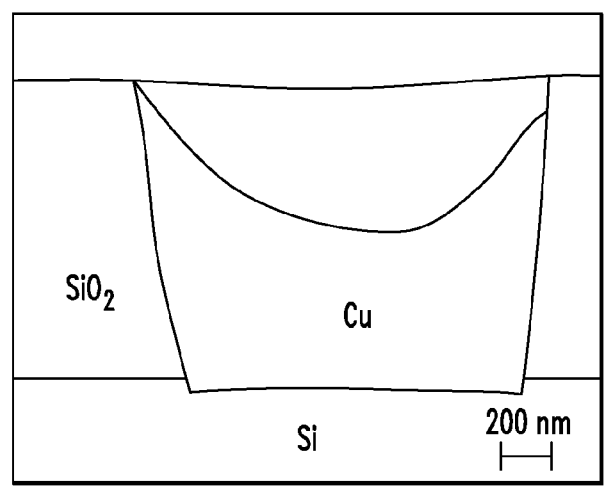
FIG. 12 is a schematic diagram of a Cu pad that has a concave shape prepared using the present techniques according to an embodiment of the present invention.

FIG. 12 is a schematic diagram 1200 of a Cu pad (labeled "Cu") that has a concave shape. The Cu pad is representative of Cu pad 1004 of FIG. 11 embedded in an oxide layer (labeled "$SiO_2$") over a Si substrate (labeled "Si"). Therefore, the Cu pad may be given a concave shape using the techniques described in conjunction with the description of FIG. 11, immediately above.

Figure 13:
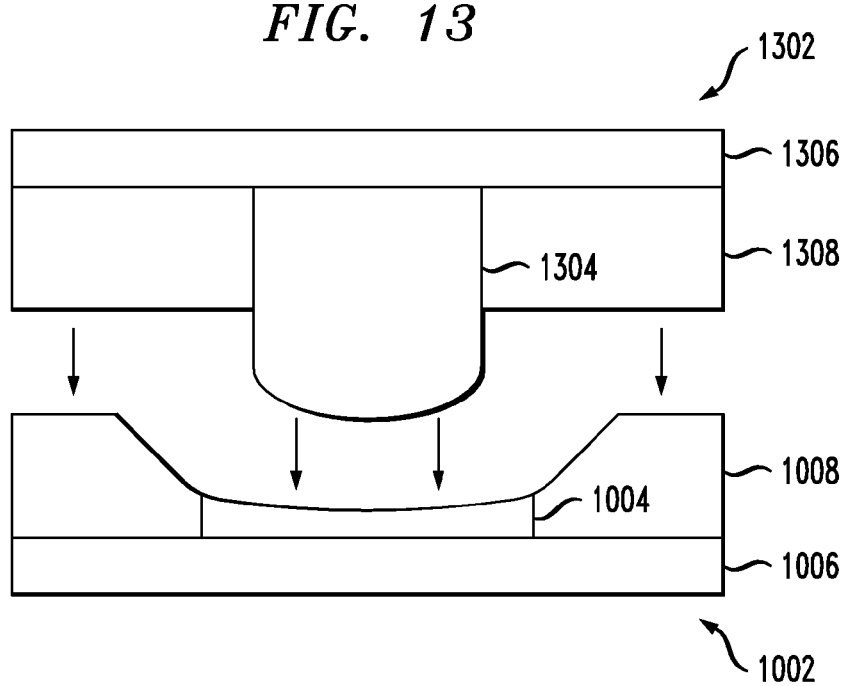
FIG. 13 is a cross-sectional diagram illustrating the first (bottom) bonding structure of FIG. 11 and a second (top) bonding structure lined up for face-to-face bonding according to an embodiment of the present invention.

FIG. 13 is a cross-sectional diagram illustrating first (bottom) bonding structure 1002 and a second (top) bonding structure 1302 lined up for face-to-face bonding. Second (top) bonding structure 1302 can be fabricated using the techniques described, for example, in conjunction with the description of FIG. 4, above. In fact, in some embodiments, the configuration of second (top) bonding structure 1302 as shown in FIG. 13 is the same as second bonding structure 402 as shown in FIG. 4. Namely, second (top) bonding structure 1302 includes a Cu stud 1304 (a top (exposed) portion of which is rounded or domed) embedded in an insulator, i.e., oxide layer 1306 and additional oxide material 1308.

As shown in FIG. 13, first (bottom) bonding structure 1002 and second (top) bonding structure 1302 are lined up for face-to-face bonding between Cu pad 1004 and Cu stud 1304, respectively. Cu stud 1304 will engage with the tapered via, like a key in a lock, and make contact with Cu pad 1004. Further, the concave shape of Cu pad 1004 will aid in self-aligning the structures when they are brought together. Namely, unlike what is shown in FIG. 13, the bonding structures are often misaligned during bonding. This misalignment can be minimized or eliminated using the present lock-and-key configuration, as is described in further detail below.

Figure 14:
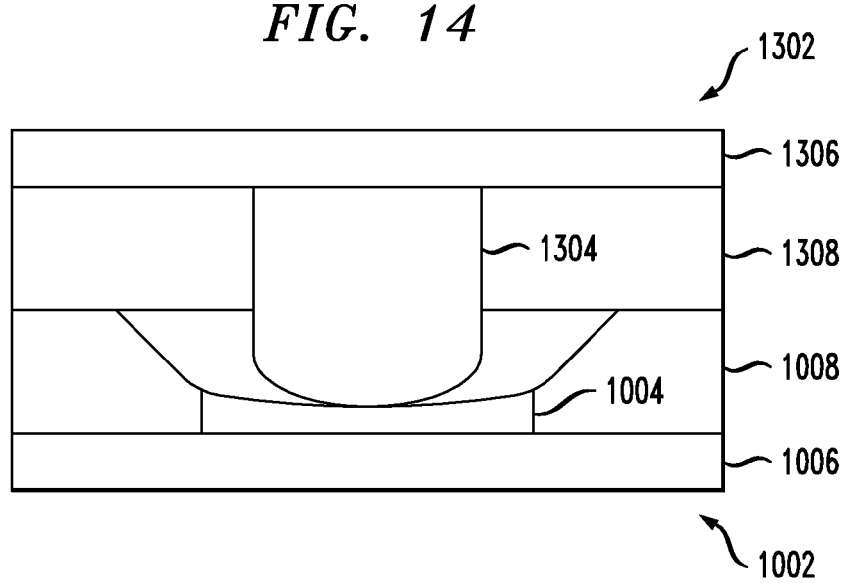
FIG. 14 is a cross-sectional diagram illustrating the first (bottom) bonding structure of FIG. 11 and the second (top) bonding structure of FIG. 13 bonded together in a face-to-face manner according to an embodiment of the present invention.

FIG. 14 is a cross-sectional diagram illustrating first (bottom) bonding structure 1002 and second (top) bonding structure 1302 bonded together in a face-to-face manner via Cu-to-Cu bonds between Cu pad 1004 and Cu stud 1304, respectively. The Cu-to-Cu bonds between the pad and stud can be formed using conventional thermocompressive bonding (see below).

Figure 15:
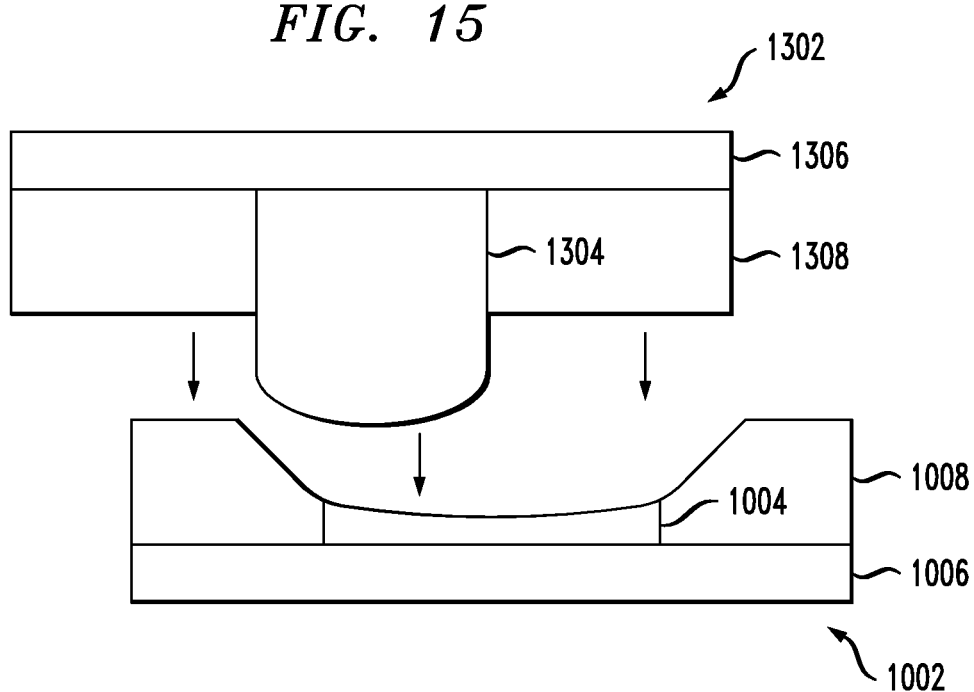
FIG. 15 is a cross-sectional diagram illustrating the first (bottom) bonding structure of FIG. 11 and the second (top) bonding structure of FIG. 13 positioned for face-to-face bonding wherein some misalignment of the bonding structures is present according to an embodiment of the present invention.

In instances when the first (bottom) bonding structure and the second (top) bonding structure are misaligned, the lock-and-key feature helps to re-align the structures. See, for example, FIGS. 15 and 16. FIG. 15 is a cross-sectional diagram illustrating first (bottom) bonding structure 1002 and second (top) bonding structure 1302 positioned for face-to-face bonding between Cu pad 1004 and Cu stud 1304, respectively. Unlike what is shown in FIG. 13, described above, there is some misalignment between the structures. However, when Cu stud 1304 engages the tapered via and concave Cu pad 1004, like a key in a lock, and when the structures are brought together, the tapered edges of the via in combination with the concave Cu pad 1004 will shift the structures relative to one another (self-correcting the alignment), moving Cu stud 1304 over to the surface of Cu pad 1004. Further, the domed shape of Cu stud 1304 ensures that it will pass smoothly over the tapered edges of the via/concave Cu pad 1004 upon compression.

Figure 16:
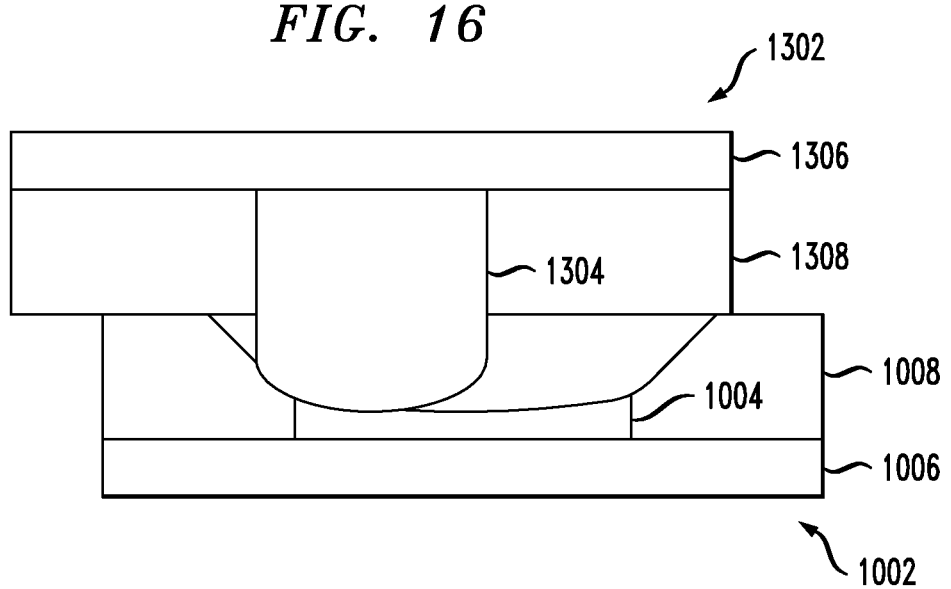
FIG. 16 is a cross-sectional diagram illustrating the first (bottom) bonding structure of FIG. 11 and the second (top) bonding structure of FIG. 13 bonded together in a face-to-face manner wherein the misalignment is automatically corrected according to an embodiment of the present invention.

FIG. 16 is a cross-sectional diagram illustrating first (bottom) bonding structure 1002 and second (top) bonding structure 1302 bonded together in a face-to-face manner via Cu-to-Cu bonds between Cu pad 1004 and Cu stud 1304, respectively. As compared to FIG. 14, while the alignment between the structures is not perfect, the tapered edges of the via and the concave Cu pad 1004 have re-aligned Cu stud 1304 with Cu pad 1004.

Figures 17, 18:
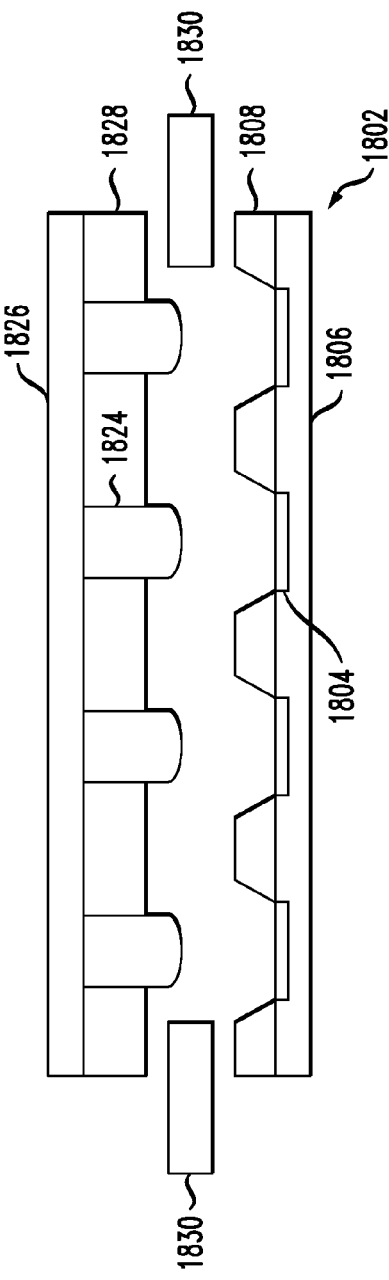
FIG. 17 is a table illustrating different bonding forces and temperature profiles for evaluation of the bonding quality of the present techniques according to an embodiment of the present invention.
FIG. 18 is a cross-sectional diagram illustrating a first (bottom) bonding structure and a second (top) bonding structure according to an embodiment of the present invention.

FIG. 17 is a table 1700 illustrating different bonding forces and temperature profiles for evaluation of the bonding quality of the lock-and-key designs presented herein. In table 1700, four different bonding force and temperature profiles are displayed, labeled A-D.

As highlighted by box 1702, the best bonding force profile for the present self-correcting/self-aligning bonding structure will be profile B, specifically (1) to start, a small force (e.g., 1,000 Newton (N)) is applied, (2) then the temperature is slowly ramped up to bonding (e.g., at a rate of six degrees Celsius (° C.) per minute (° C./min)) and (3) when the bonding temperature (e.g., a bonding temperature of from about 350° C. to about 400° C.) is reached, the full bonding force is applied (e.g., 10,000 N). By applying a small force to start, it creates the chance to bring the two bonding structures into contact. Since the force is small, the self-correction can be performed without any restrictions from the bonding force. In this example the small force can be one killiNewton (kN) (or less 10% of the full bonding force), while the full bonding force can be as high as 10 kN or more, depending on the maximum of the bonding force.

FIGS. 18-22, described below, present an exemplary bonding process involving the present techniques. For example, FIG. 18 is a cross-sectional diagram illustrating a first (bottom) bonding structure 1802 and a second (top) bonding structure 1820. First (bottom) bonding structure 1802 and second (top) bonding structure 1820 can be fabricated using the techniques described above. In fact, in some embodiments, the configuration of first (bottom) bonding structure 1802 and second (top) bonding structure 1820 is the same as first (bottom) bonding structure 102 as shown, e.g., in FIG. 2, and second (top) bonding structure 402 as shown, e.g., in FIG. 4, respectively. However, in this instance multiple Cu pads and studs are being employed.

Thus, first (bottom) bonding structure 1802 includes Cu pads 1804 embedded in an insulator, i.e., oxide layer 1806 and additional oxide material 1808, and vias in the insulator over Cu pads 1804, the vias having tapered sidewalls. It is notable that Cu pads 1804 may be further configured to have a concave shape (not shown), for example, using the techniques described in conjunction with the description of FIG. 11, above, which can advantageously aid in the self-aligning bonding process. Second (top) bonding structure 1820 (shown flipped for face-to-face bonding with first (bottom) bonding structure 1802) includes Cu studs 1824 (top (exposed) portions of which are rounded or domed) embedded in an insulator, i.e., oxide layer 1826 and additional oxide material 1828.

As shown in FIG. 18, bonder clips 1830 are used to separate the bonding structures before bonding in order to achieve precise alignment results. Bonder clips and the use thereof in conjunction with bonding tools and equipment are known to those of skill in the art and thus are not described further herein.

Figure 19:
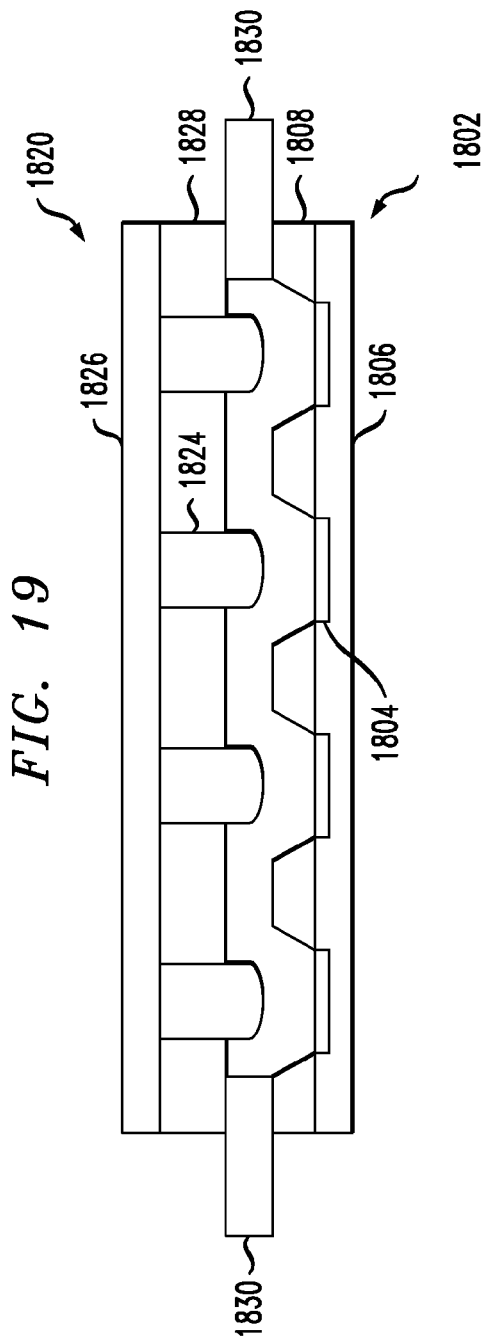
FIG. 19 is a cross-sectional diagram illustrating the first (bottom) bonding structure and the second (top) bonding structure of FIG. 18 lined up for face-to-face bonding according to an embodiment of the present invention.

Despite the use of bonder clips 1830, misalignment of the bonding structures is likely. For example, FIG. 19 is a cross-sectional diagram illustrating first (bottom) bonding structure 1802 and second (top) bonding structure 1820 lined up for face-to-face bonding between Cu pads 1804 and Cu studs 1824, respectively. As shown in FIG. 19, a small amount of misalignment of the bonding structures is present. At this point in the process, the two bonding structures are registered together (i.e., first aligned and then bonded together) via bonder clips 1830, which permits the bonding structures to be moved to the bonder to start the bonding process. A bonder is a tool commonly known in the art to hold two structures together by providing force at a high temperature.

Figure 20:
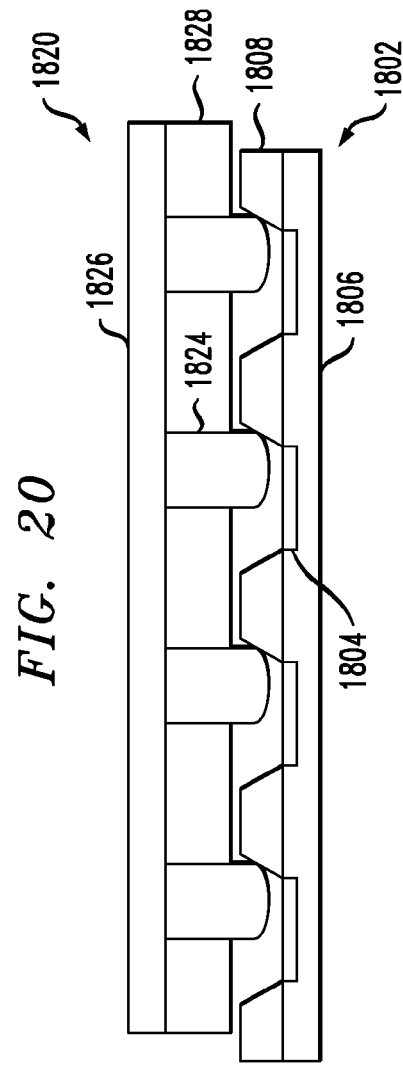
FIG. 20 is a cross-sectional diagram illustrating the first (bottom) bonding structure and the second (top) bonding structure of FIG. 18 bonded together in a face-to-face manner according to an embodiment of the present invention.

FIG. 20 is a cross-sectional diagram illustrating first (bottom) bonding structure 1802 and second (top) bonding structure 1820 bonded together in a face-to-face manner via Cu pads 1804 and Cu studs 1824, respectively. As shown in FIG. 20, bonder clips 1830 have been removed and the two bonding structures will make real contact at this moment. Again note that a small amount of misalignment is present.

Figure 21:
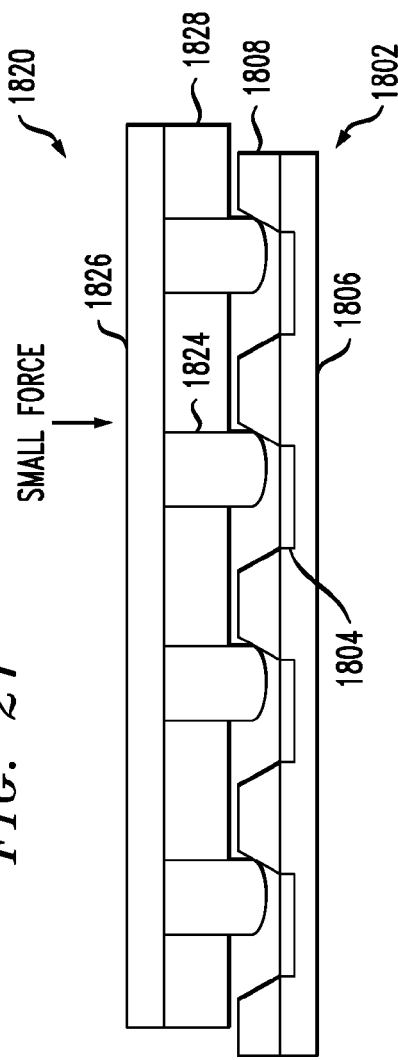
FIG. 21 is a cross-sectional diagram illustrating a small force being applied to the bonding structures of FIG. 20 according to an embodiment of the present invention.

FIG. 21 is a cross-sectional diagram illustrating a small force being applied to the bonding structures. The force can be applied to both bonding structures, or as shown in FIG. 21, to the top bonding structure while the bottom bonding structure sits on a flat surface. This small starting force (e.g., 1,000 N see description of FIG. 17, above) allows the bonding structures with misalignment to automatically fit together by way of the present Cu pad/stud lock-and-key structure.

Figure 22:
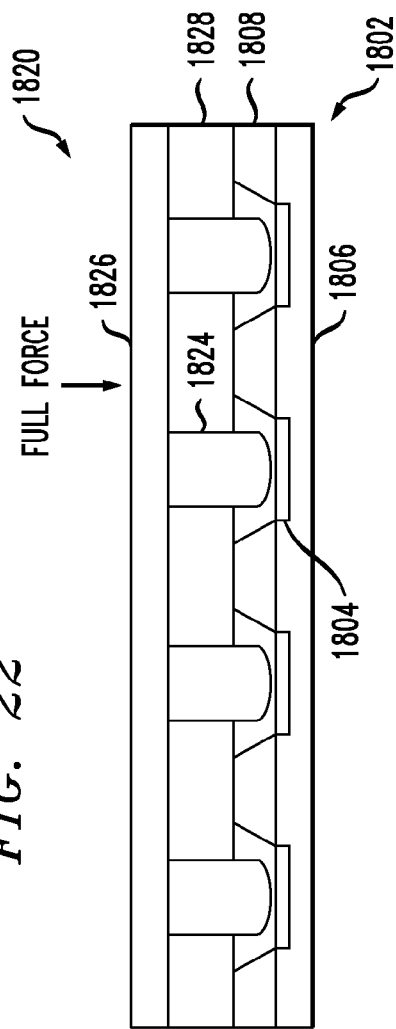
FIG. 22 is a cross-sectional diagram illustrating a full force being applied to the bonding structures of FIG. 21 according to an embodiment of the present invention.

FIG. 22 is a cross-sectional diagram illustrating a full force being applied to the bonding structures. The force can be applied to both bonding structures, or as shown in FIG. 22, to the top bonding structure while the bottom bonding structure sits on a flat surface. This full force (e.g., 10,000 N see description of FIG. 17, above) completes the bonding process and as shown in FIG. 22 permits further self-alignment of the bonding structures to occur. The temperature ramp up described above can occur after the two bonding structures are contacted together using the small force (see FIG. 21). This however is not a requirement and the temperature ramp up can occur at a different point in the process.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A bonding method, comprising the steps of:
   providing a first bonding structure having at least one copper pad embedded in a first insulator and at least one via in the first insulator over the copper pad, wherein the via has tapered sidewalls;
   providing a second bonding structure having at least one copper stud embedded in a second insulator, wherein a portion of the copper stud is exposed for bonding and has a domed shape which is obtained by polishing the exposed portion of the copper stud to obtain the domed shape;
   placing bonder clips between the first bonding structure and the second bonding structure;
   bringing the first bonding structure and the second bonding structure together;
   removing the bonder clips; and
   bonding the first bonding structure to the second bonding structure by way of a copper-to-copper bonding between the copper pad and the copper stud, wherein the copper stud and the via have complementary shapes in that during the bonding step the copper stud engages the via such that the tapered sidewalls of the via shift the first bonding structure and the second bonding structure relative to one another thereby self-aligning the copper stud with the copper pad, wherein the bonding step comprises: i) applying a first bonding force, ii) increasing temperature until a bonding temperature is reached, and iii) applying a second bonding force, wherein the second bonding force is greater than the first bonding force.

2. The method of claim 1, further comprising the step of: polishing the copper pad to give the copper pad a concave shape.

3. The method of claim 1, further comprising the step of: flipping the second bonding structure to permit face-to-face bonding with the first bonding structure.

4. The method of claim 1, wherein the first bonding force is about 10% of the second bonding force.

5. The method of claim 1, wherein the first bonding force is about 1,000 Newtons and the second bonding force is about 10,000 Newtons.

6. The method of claim 1, wherein the temperature is increased at a rate of about six degrees Celsius per minute.

7. The method of claim 1, further comprising the step of: tapering the sidewalls of the via using reactive ion etching.

8. The method of claim 2, wherein the copper pad is given a concave shape using copper chemical-mechanical polishing.

* * * * *